US005999516A

United States Patent [19]

Suzuki et al.

[11] Patent Number: 5,999,516

[45] Date of Patent: Dec. 7, 1999

[54] MULTIPLEX COMMUNICATION EQUIPMENT AND COMMUNICATION TEST METHOD THEREOF

[75] Inventors: Kaoru Suzuki; Kazumasa Azuma; Ikuo Aso; Sakae Watanabe, all of Koriyama, Japan

[73] Assignee: Hitachi Telecom Technologies, Ltd., Koriyama, Japan

[21] Appl. No.: 08/927,689

[22] Filed: Sep. 11, 1997

[30] Foreign Application Priority Data

Sep. 11, 1996 [JP] Japan .................................... 8-261229

[51] Int. Cl.[6] .......................... G01R 31/08; G08C 15/00; H04M 1/24

[52] U.S. Cl. ............................ 370/244; 370/249; 379/15; 714/43

[58] Field of Search .................................... 370/241, 242, 370/244, 249; 379/15; 714/43

[56] References Cited

U.S. PATENT DOCUMENTS

| | | | |
|---|---|---|---|
| 5,613,061 | 3/1997 | Taylor | 714/43 |
| 5,706,280 | 1/1998 | Kosugi et al. | 370/244 |
| 5,809,108 | 9/1998 | Thompson et al. | 379/15 |

*Primary Examiner*—Hassan Kizou
*Assistant Examiner*—John Pezzlo
*Attorney, Agent, or Firm*—Foley & Lardner

[57] ABSTRACT

Multiplex communication equipment 1A used in a multiplex communication system, has a memory portion 12 memorizing the equipment number for the communication test. When there is an incoming call with reference to the same equipment number as one of the multiplex line 1A from the multiplex line 2A, the accommodation line portion 14*a* under setting a loop receives the incoming call and the communication test is done through a route for the communication test. When there is no accommodation line under setting the loop, the incoming call is rejected.

3 Claims, 5 Drawing Sheets

MULTIPLEX COMMUNICATION EQUIPMENT AND COMMUNICATION TEST METHOD THEREOF

CROSS-REFERENCES OF RELATED APPLICATIONS

This application claims all benefits accruing under 35 U.S.C §119 from the Japanese Patent Application No. 8-261229, filed Sep. 11, 1996.

BACKGROUND OF THE INVENTION

1. Field of the Invention

The invention relates to a multiplex communication equipment used in a multiplex communication system consisting of a plurality of multiplex communication equipment, and a communication test method for the multiplex communication equipment, and is suitable to a multimedia multiplex equipment.

2. Description of the Related Art

Conventionally, according to the multiplex communication system, a communication test of the multiplex communication system is carried out by connecting test appliances at both ends of an accommodation line while carrying out the operations of connecting communication routes through a common line signal system, or by setting a loop on the one end of an accommodation line and connecting a test appliance to the other end of the accommodation line.

However, the conventional communication test method mentioned above must control the connections from a side of accommodation lines, so it is necessary to use connection appliances and it is necessary to prepare such appliances corresponding to each kinds of an accommodation line interface. Furthermore, the communication test can be done only at the positions of both the ends of the accommodation line. Accordingly, when a line trouble happens, it has been difficult to select and sort out the trouble position or the trouble part of the line. It is necessary to attach and dismantle these test appliances to and from the accommodation lines to which the test appliances are connected, increasing the number of chance of uncompleted connection and wrong connection after having carried out the communication test.

The invention is invented to solve the problem of the prior art and a purpose of the invention is to provide a multiplex communication equipment and a communication test method for such equipment, which can carry out the communication test without connecting test appliances to a side of accommodation lines.

BRIEF SUMMARY OF THE INVENTION

According to the communication test method of multiplex communication equipment in a multiplex communication system having a plurality of multiplex communication equipment connected to each other through multiplex lines, the multiplex communication equipment has a memory portion for memorizing an equipment number for the communication test; when there is an incoming call with reference to the same equipment number from the multiplex lines, the multiplex communication equipment receives the incoming call by means of an accommodation line portion under setting a loop and carries out the communication test through a route for the communication test,; when there is no accommodation line under setting the loop, the multiplex communication equipment rejects the incoming call.

According to the multiplex communication equipment above in a multiplex communication system provided with a plurality of multiplex communication equipment connected to each other through multiplex lines, the multiplex communication equipment has an input/output portion for sending-out and receiving a maintenance data of a maintenance terminal through communication lines, a memory portion for storing a data used to judge whether, when there is an incoming call from the multiplex lines, the incoming call is possible to be received or not, an accommodation line portion having interface functions respectively provided on every each of accommodation lines, a multiplex portion for connecting the accommodation lines to the multiplex lines, and an equipment control portion for judging whether the incoming call from the multiplex lines is to be received or not according to an instruction signal of above-mentioned portions, the memory portion memorizes an equipment number for the communication test, when there is an incoming call with reference to the same equipment number from the multiplex lines, the equipment control portion makes the accommodation line portion under setting the loop receive the incoming call and carries out the communication test through a route for the communication test, and when there is no accommodation line under setting the loop, the equipment control portion rejects the incoming call.

According to the multiplex communication equipment described above the accommodation line portion has a communication test connection controller for exclusively carrying out connections of communication routes for the communication test though a common line signal system, a connection control portion for carrying out connections of communication routes other than the communication routes for the communication test, a data control portion for sending out a fixed data, if necessary, to the accommodation line during carrying out the communication test, a communication test portion for carrying out a turn-back of the data through the multiplex portion or carrying out the communication test, and an accommodation line control portion for sending-out control instructions to respective portions above-mentioned according to the instruction signal from the equipment control portion.

According to the invention, by providing an equipment number for the communication test, it is possible to recognize that it is a control for the communication test when receiving the incoming call, and when there is the incoming call with reference to the equipment number, the incoming call is received at a position of the accommodation line under setting a loop and it is connected. As a result, a communication test for the connected communication routes is carried out. As described above, it is possible to respond in the multiplex communication equipment, so it is possible to connect the multiplex communication equipment without a relation to the side of accommodation lines.

Also, even if there is the incoming call with reference to the equipment number, the incoming call is rejected when the loop is not set. Therefore, there is no effect on the accommodation lines. Thus, it is possible to carry out the connections and the communication test between these multiplex communication equipments. Further, it is possible to carry out the communication test without connecting the test appliance to side of the accommodation line.

DETAILED DESCRIPTION OF THE INVENTION

Figure 1:
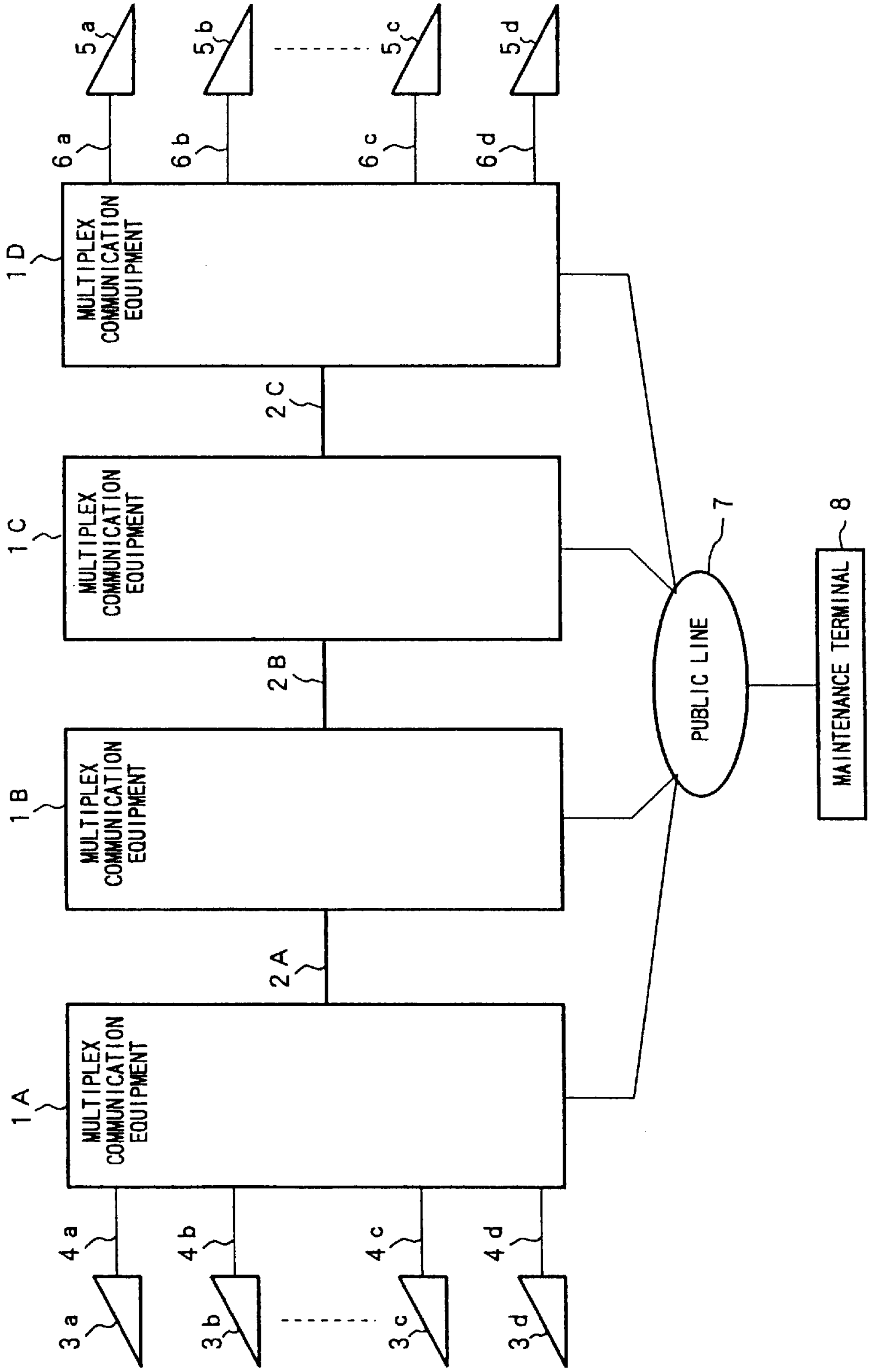
FIG. 1 is a structure view of the multiplex communication system to which the invention is applied.

FIG. 1 is a structure view of the multiplex communication system to which the invention is applied. These multiplex communication equipments 1A, 1B, 1C, 1D are connected to each other through the multiplex lines 2A, 2B, 2C as a junction line.

With the multiplex communication equipment 1A, data terminal equipments (DTE) 3*a*, 3*b*, 3*c*, 3*d* are connected through accommodation lines 4*a*, 4*b*, 4*c*, 4*d*. With the multiplex communication equipment 1D, DTEs 5*a*, 5*b*, 5*c*, 5*d* are connected through other accommodation lines 6*a*, 6*b*, 6*c*, 6*d*. The multiplex communication equipment 1B and 1C are used as a junction equipment.

Also, multiplex communication equipment 1A to 1D are connected to a maintenance terminal 8 through the public line 7. These multiplex communication equipments 1A to 1D are maintained by this maintenance terminal 8.

Figure 2:
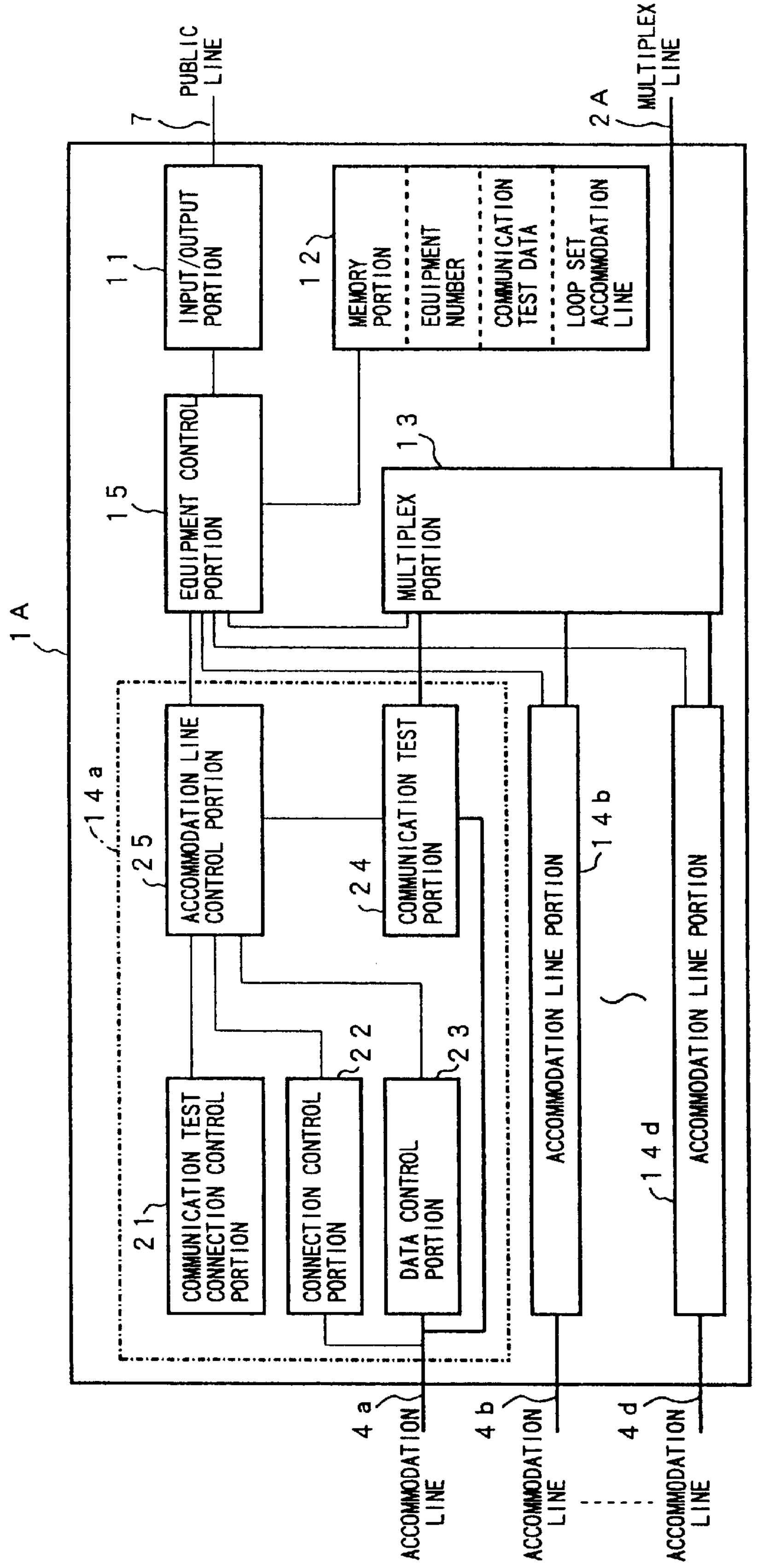
FIG. 2 is a block diagram of the multiplex communication equipment.

FIG. 2 is a block diagram showing a structure of the multiplex communication equipment 1A. The multiplex communication equipment 1A has an input/output portion 11 for receiving an instruction data from the maintenance terminal and for sending-out a response data to the maintenance terminal 8, a memory portion 12 for storing an necessary data to judge whether, when there is the incoming call from the multiplex line 2A, the incoming call is possible to be received or not, a multiplex portion 13 for connecting the accommodation lines 4*a*–4*d* to the multiplex line 2A, accommodation line portions 14*a*–14*d* having interface function that supports every one of respective accommodation lines 4*a*–4*d*,and an equipment control portion 15 for judging whether the incoming call from the multiplex line 2A is to be received or not according to the instruction signal from various portions above-mentioned.

The memory portion 12 stores an equipment number of the multiplex communication equipment 1A, data which shows that it is under a communication test, and accommodation lines under setting a loop.

The accommodation line portion 14*a* has a communication test connection controller 21 for exclusively carrying out connections of communication routes for the communication test by means of a common line signal system, a connection control portion 22 for connecting the devices other than the communication routes for the communication test, a data control portion 23 for sending-out a fixed data, if necessary, to the side of accommodation lines 4*a*–4*d* during carrying out the communication test, a communication test portion 24 for carrying out a turn-back of the data through the multiplex portion or for carrying out the communication test, and an accommodation control portion 25 for sending-out control instructions to various above-mentioned portions according to the instruction signal from the equipment control portion 15.

Next, operation of the multiplex communication equipments 1A and 1D will be explained with reference to the flow charts shown in FIG. 3 to FIG. 7.

Figure 3:
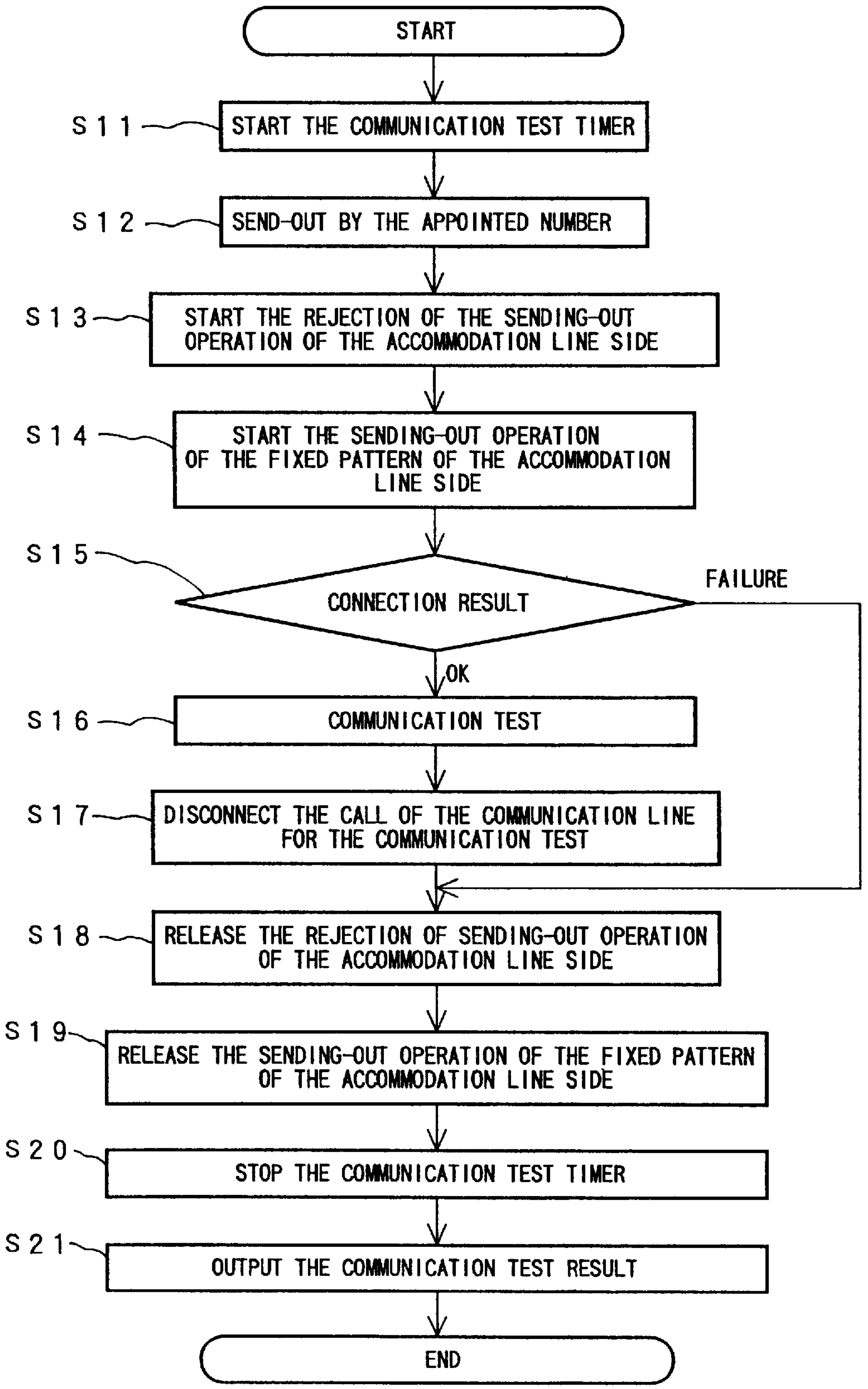
FIG. 3 is a flow chart explaining a communication test process.

FIG. 3 is a flow chart depicting a communication test process carried out when a communication test instruction is sent to the multiplex communication equipment 1A from the maintenance terminal 8.

This process starts when the equipment control portion 15 receives a communication test instruction from the maintenance terminal 8 through the input/output portion 11 and when the equipment control portion 15 refers to a condition of equipment stored in the memory portion 12 and the equipment control portion 15 judges that it is possible to carry out the communication test.

First, after a start of the process, a communication test timer is started (step S11) and a communication test instruction is sent to the accommodation line control portion 25 of the accommodation line portions 14*a*–14*d*. The accommodation line control portion 25 sends, after receiving the communication test instruction, an sending-out demand to the communication test connection control portion 21 in order to connect the communication route for communication test and makes the control portion 21 send out the sending-out demand (step S12). During the communication test, the accommodation line control portion 25 sends out an instruction to the connection control portion 22 so as to reject the sending-out demand dispatched from the accommodation lines 4*a*–4*d* (step S13). During the communication test, the accommodation line control portion 25 sends out, if necessary, an instruction to the data control portion 23 so as to make the data control portion 23 send a fixed data pattern (Step S14).

After a connection is completed, a connection result is sent from the communication test connection control portion 21 to the accommodation line control portion 25 (step S15). The accommodation line control portion 25 sends out an instruction to the communication test portion 24 so as to carry out the communication test only when the accommodation line control portion 25 judging that the connection result is good (step S16).

After having carried out an operation of the communication test, a disconnection instruction is sent from the accommodation line control portion 25 to the communication test connection control portion 21 in order to disconnect a call of the communication route for the communication test, and the call is disconnected (step S17).

Next, the accommodation line control portion 25 sends out a rejection release instruction to the connection control portion 22 which is rejecting the sending-out demand from the accommodation lines 4*a*–4*d* (step S18). Furthermore, the accommodation line control portion 25 sends out a sending stop instruction to the data control portion 23 which is sending the fixed data pattern (step S19), and sends out a communication test result to the equipment control portion 15.

The equipment control portion 15, after having received the communication test result, makes the communication test timer stop (step S20), and sends out the communication test result through the input/output portion 11 to the maintenance terminal 8 (step S21), ending the process.

Figure 4:
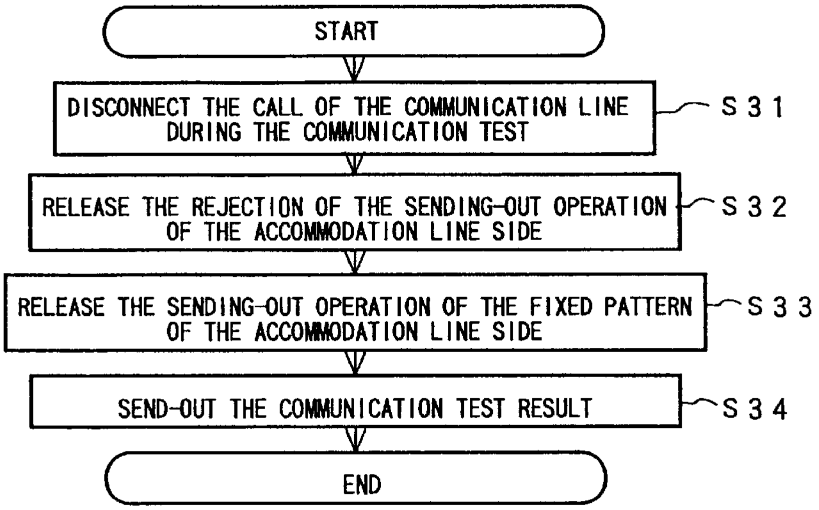
FIG. 4 is a flow chart explaining the process to be carried out when the communication test timer becomes out of time.

When the communication test timer is made out of time, the process is transferred to one shown by a flow chart of FIG. 4. That is, when some time-out of the communication test timer is happened in the equipment control portion 15, the accommodation line control portion 25 sends out a disconnection instruction to the communication test connection control portion 21 to compulsory suspend the communication test and disconnects the call of the communication line during carrying out the communication test (step S31).

Next, the accommodation line control portion 25 sends out the rejection release instruction to the connection control portion 22 which is rejecting the sending-out demand from the accommodation lines 4a–4d (step S32). Furthermore, the accommodation line control portion 25 sends out a sending stop instruction to the data control portion 23 which is sending the fixed data pattern (step S33), and sends out the communication test result to the equipment control portion 15. Receiving the test result, the equipment control portion 15 sends out the communication test result through the input/output portion 11 to the maintenance terminal 8 (step S34), ending the process.

Figure 5:
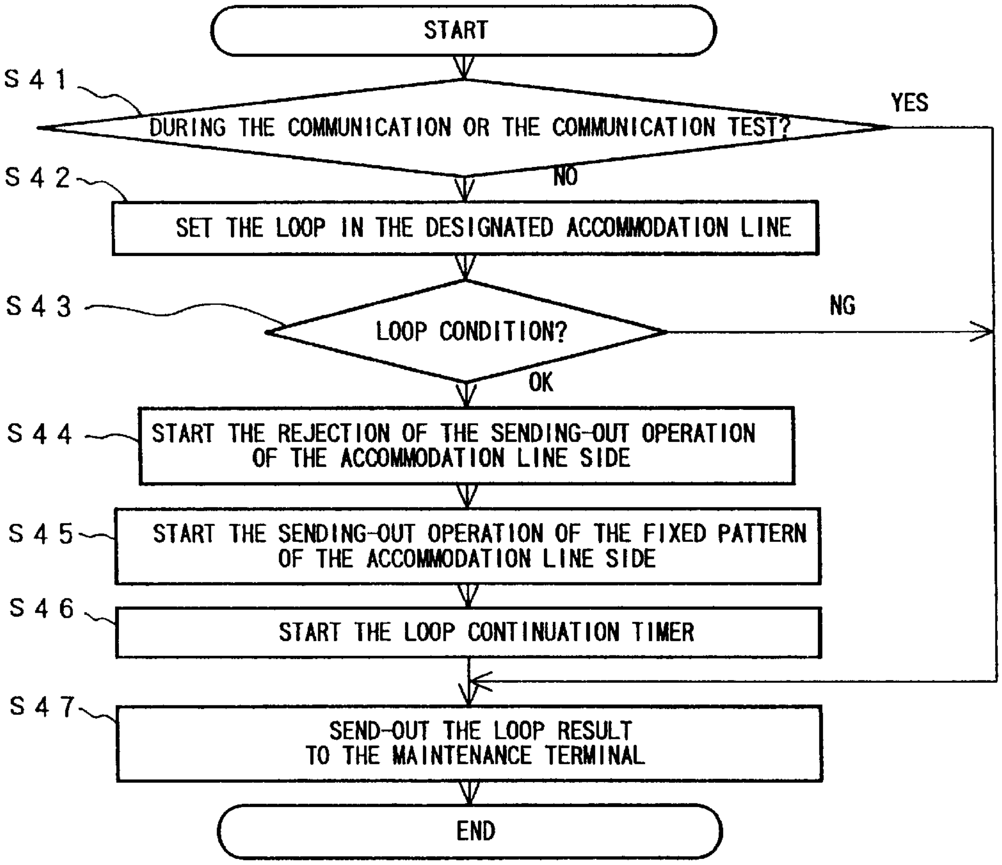
FIG. 5 is a flow chart explaining a loop setting process.

Next, with reference to the flow chart shown in FIG. 5, a loop set operation carried out when a loop instruction is sent from the maintenance terminal 8 to the multiplex communication equipment 1D will be explained.

This process refers the equipment condition stored in the memory portion 12 when the equipment control portion 15 receiving a loop instruction from the maintenance terminal 8 through the input/output portion 11, and judges whether it is possible to set any loop or not (step S41). If it is possible, a loop instruction is sent to the accommodation line control portion 25.

After receiving the instructions, the accommodation line control portion 25 sends out an instruction to the communication test portion 24 in order to carry out a loop set in a designated accommodation line and carries out such a loop set (step S42). The communication test portion 24 sends out a loop result to the equipment control portion 15 through the accommodation line control portion 25.

When a loop condition is good (step S43), the accommodation line control portion 25 sends out an instruction to the connection control portion 22 in order to reject the sending-out demand from the accommodation line under the communication test (step S44). The accommodation line control portion 25 sends out, if necessary, an instruction to the data control portion 23 in order to send out, the fixed data pattern during the communication test (step S45). The equipment control portion 22 makes the loop continuation timer start in order to make a loop continue for a fixed time (step S46), and the equipment control portion 15 sends out a loop result from the input/output portion 11 to the maintenance terminal 8 (step S47).

Figure 6:
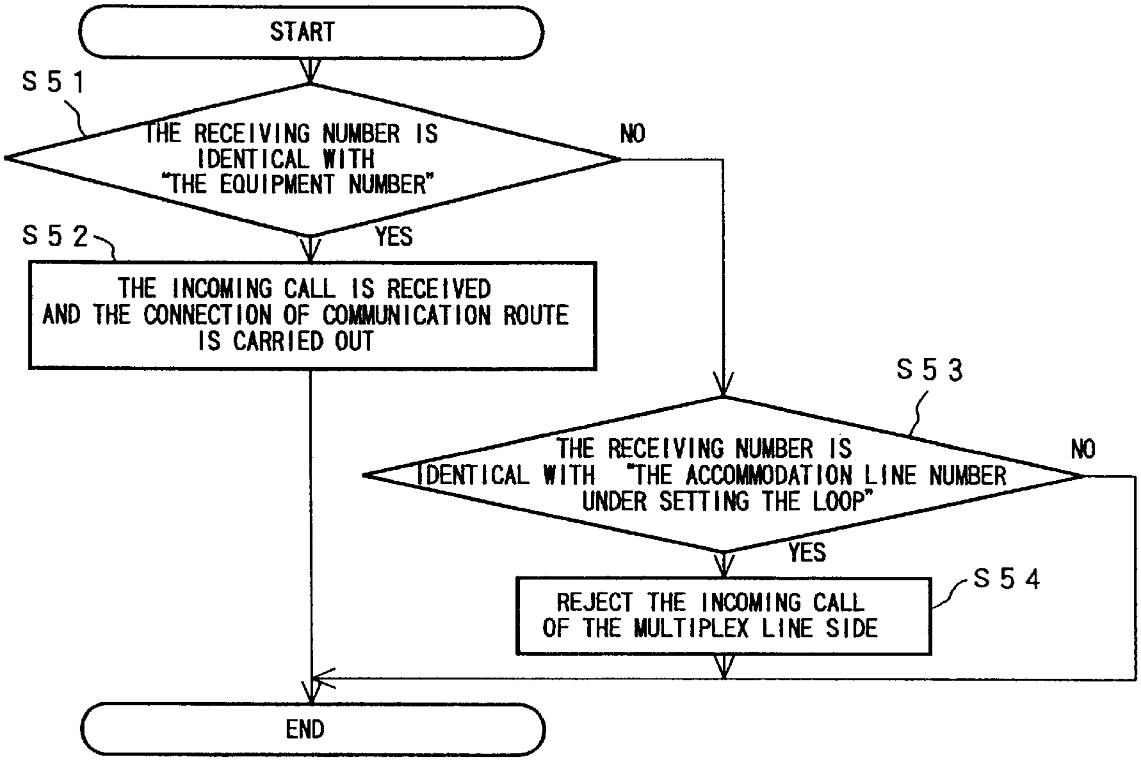
FIG. 6 is a flow chart explaining a receive-call control process.

FIG. 6 is a flow chart depicting an operation of calling-receiving control when the incoming call being dispatched from the multiplex line 2C and the incoming call being received after setting a loop. The equipment control portion 15 collates a receiving number of an incoming call sent, to the equipment control portion 15 from the multiplex portion 13 with an equipment number stored in the memory portion 12 in order to know whether the receiving number is identical with the equipment number or not (step S51). When they are identical with each other, tile incoming call is received on the communication test connection control portion 21 through the accommodation line control portion 25 of the accommodation line under setting the loop, and a connection of communication route is carried out (step S52).

When the receiving number is not identical with the equipment number, the receiving number is collated with the accommodation line number under setting a loop in order to check whether the former is identical with the latter or not (step S53). When they are identical with each other, the equipment control portion 15 rejects the incoming call of the multiplex line side (step S54). When the loop is not set on the multiplex communication equipment 1D or when the incoming call with reference to the same equipment number is received, the equipment control portion 15 rejects a receiving of the incoming call.

Figure 7:
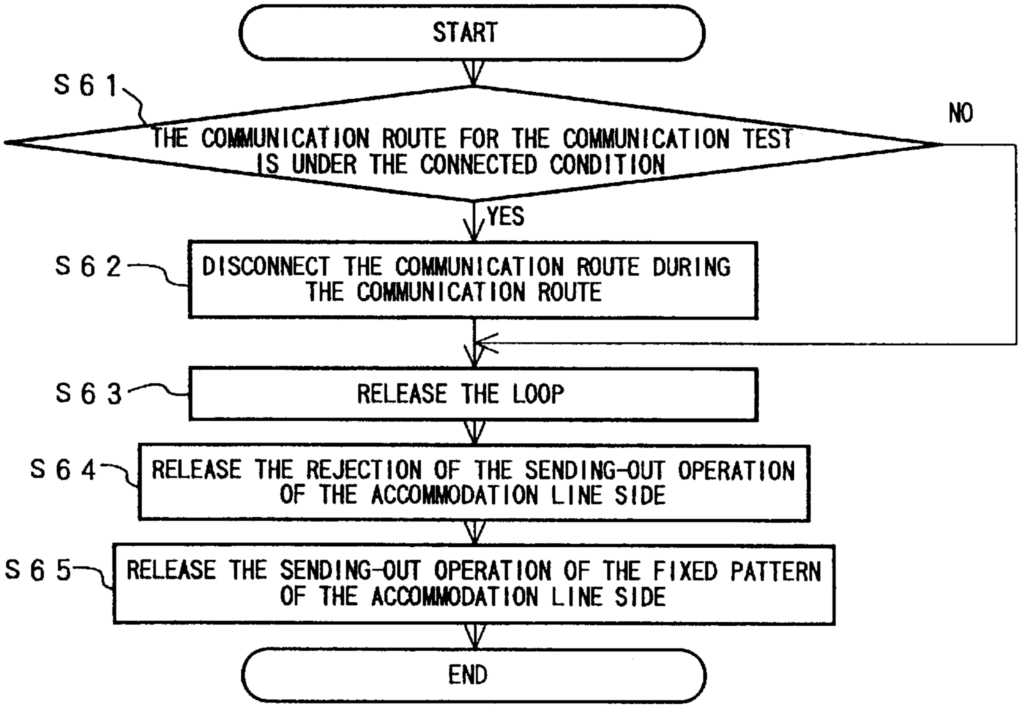
FIG. 7 is a flow chart explaining a time-out of the loop continuation timer or loop release operation.

When some time-out of the loop continuation timer is happened or when the loop is released, the process is transferred to one shown by the flow chart of FIG. 7. That is, when a time-over of the loop continuation timer happens in the equipment control portion 15 or when the equipment control portion 15 receives a loop release instruction from the input/output portion 11, the accommodation line control portion 25 receives the loop release instruction and judges whether the communication route for the communication test is under the connected condition or not (step S61). When it is under the connected condition, a disconnection instruction is sent to the communication test connection control portion 21 from the equipment control portion 15 through the accommodation line control portion 25 (step S62). As a result, the communication route during the communication test is disconnected.

After the communication route during the communication test is disconnected, the accommodation line control portion 25 sends out a loop release instruction to the communication test portion 24 and, as a result, the communication test portion 24 makes a loop release (step S63). Next, the accommodation line control portion 25 sends out a rejection release instruction to the connection control portion 22 which is rejecting the sending-out from the accommodation line side (step S64) and furthermore sends out a sending release instruction to the data control portion 23 that is sending out the fixed data pattern (step S65), ending the process.

According to this invention, in a communication test of the multiplex communication system, it is possible to carry out connections and communication tests among these multiplex communication equipments, so it becomes unnecessary to install and dismantle these test appliances to the accommodation lines. Also, because the turn-back of lines in the necessary multiplex communication equipment is possible, it becomes possible to divide and remove the trouble line.

We claim:

1. A communication test method for a multiplex communication equipment used in a multiplex communication system having a plurality of multiplex communication equipment connected to each other through multiplex lines and a maintenance terminal for managing the plurality of multiplex communication equipment, wherein each of the plurality of multiplex communication equipment includes:

a plurality of accommodation line portions for connecting to other communication terminals, and a memory portion for storing an equipment number for a corresponding one of the multiplex communication equipment in which the memory portion is disposed, wherein each of the multiplex communication equipment judges whether or not a receiving number from an incoming call is identical with the equipment number stored in the corresponding memory portion, when detecting the incoming call through the multiplex lines, wherein, when the receiving number is identical with the equipment number, the multiplex communication equipment selects one of the accommodation line portions that is available to be set to a loop path according to an instruction from the maintenance terminal, the multiplex communication equipment makes the selected accommodation line portion receive the incoming call, and the multiplex communication equipment makes the selected accommodation line portion carry out a communication test through a route for the communication test, and wherein, when no accommodation line portion is available to be set to the loop path, the multiplex communication equipment rejects the incoming call.

2. A multiplex communication system having a plurality of multiplex communication equipment connected to each other through multiplex lines and a maintenance terminal for managing the plurality of multiplex communication terminals, wherein each of the plurality of multiplex communication equipment includes:

an input/output portion for sending out and receiving data with the maintenance terminal through a communication line, a plurality of accommodation line portions for connecting to other communication terminals, a memory portion for storing an equipment number for a corresponding one of the multiplex communication equipment in which the memory portion is disposed, a multiplex portion for connecting the plurality of accommodation line portions to the multiplex line, and an equipment control portion for judging whether or not a receiving number from an incoming call is identical with the equipment number stored in the memory portion, when detecting the incoming call through the multiplex line, wherein each of the accommodation line portions includes:

a communication test portion for making one of the corresponding accommodation line portion be set to a loop path in accordance with an instruction from the maintenance terminal, and a communication test control portion for receiving the incoming call for a communication test, wherein, when the equipment control portion judges that the receiving number is identical with the equipment number, the equipment control portion selects one of the accommodation line portions to be set to the loop path if the one of the accommodation line portions is available to be set to the loop path, the equipment control portion makes the selected accommodation line portion receive the incoming call, and the equipment control portion makes the selected accommodation line portion carry out the communication test through a route for the communication test, and wherein, when no accommodation line portion is available to be set to the loop path, the multiplex communication equipment rejects the incoming call.

3. A multiplex communication system having a plurality of multiplex communication equipment connected to each other through multiplex lines and a maintenance terminal for managing the plurality of multiplex communication equipment, wherein each of the plurality of multiplex of the plurality of multiplex communication equipment includes:

an input/output portion for sending out and receiving data with the maintenance terminal through a communication line, a plurality of accommodation line portions for connecting to other communication terminals, a memory portion for storing an equipment number for a corresponding one of the multiplex communication equipment in which the memory portion is disposed, a multiplex portion for connecting the plurality of accommodation line portions to the multiplex line, and an equipment control portion for judging whether or not a receiving number from an incoming call is identical with the equipment number stored in the memory portion, when detecting the incoming call through the multiplex line, wherein each of the plurality of accommodation line portions includes:

a communication test control portion for exclusively connecting to a first route for a communication test through a common line signal system, a connection control portion for connecting to a second route for the communication test, the second route being different from the first route, a data control portion for sending out fixed data, if necessary, to the corresponding accommodation line portion during carrying out of the communication test, and an accommodation line control portion for controlling the corresponding accommodation line portion in accordance with an the instruction from the equipment control portion, wherein, when the equipment control portion judges that the receiving number is identical with the equipment number, the equipment control portion selects one of the accommodation line portions to be set to a loop path according to an instruction from the maintenance terminal, the equipment control portion makes the selected accommodation line portion receive the incoming call, and the equipment control portion makes the selected accommodation line portion carry out the communication test through a route for the communication test, and wherein, when there is no accommodation line portion available to be set to the loop path, the multiplex communication equipment rejects the incoming call.

* * * * *